(12) United States Patent
Kami et al.

(10) Patent No.: US 7,583,011 B2
(45) Date of Patent: Sep. 1, 2009

(54) PACKAGE OF SURFACE-MOUNTABLE ELECTRONIC COMPONENT

(75) Inventors: Keiichi Kami, Toyama (JP); Mitsunori Ishimasa, Toyama (JP); Manabu Sumita, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 919 days.

(21) Appl. No.: 10/770,763

(22) Filed: Feb. 3, 2004

(65) Prior Publication Data

US 2004/0218769 A1 Nov. 4, 2004

(30) Foreign Application Priority Data

Apr. 23, 2003 (JP) ............................. 2003-118025
Dec. 24, 2003 (JP) ............................. 2003-427166

(51) Int. Cl.
*H01L 41/053* (2006.01)
(52) U.S. Cl. ...................... 310/348; 381/189; 381/190
(58) Field of Classification Search .................. 310/348
See application file for complete search history.

(56) References Cited

U.S. PATENT DOCUMENTS

| 4,403,695 | A * | 9/1983 | Raymoure et al. ........... 206/497 |
| 6,264,034 | B1 * | 7/2001 | Bacques et al. ............. 206/497 |
| 6,653,762 | B2 * | 11/2003 | Takeshima .................. 310/340 |
| 2002/0000649 | A1 * | 1/2002 | Tilmans et al. .............. 257/678 |

FOREIGN PATENT DOCUMENTS

JP 2000-310990 7/2000

OTHER PUBLICATIONS

Official communication in the counterpart Chinese Application No. 200410005981.5, mailed on Feb. 2, 2007.

* cited by examiner

*Primary Examiner*—Walter Benson
*Assistant Examiner*—Bryan P Gordon
(74) *Attorney, Agent, or Firm*—Keating & Bennett, LLP

(57) ABSTRACT

A package of a surface-mountable electronic component to be reflow-soldered to a circuit board at about 250° C. or more includes a case and a cover. The cover has a softening temperature lower than the reflow temperature, and the case has a softening temperature higher than the reflow temperature. In the package, softening the cover compensates for the stress on the bonded surfaces resulting from a difference in thermal expansion between the case and the cover caused during reflow.

20 Claims, 6 Drawing Sheets

PACKAGE OF SURFACE-MOUNTABLE ELECTRONIC COMPONENT

BACKGROUND OF THE INVENTION

1. Field of the Invention

The present invention relates to a package structure of a surface-mountable electronic component.

2. Description of the Related Art

Piezoelectric sound components have been widely used as a piezoelectric sounders for generating audible alarm or operational sound, a piezoelectric receiver, or other components in electronic apparatuses, home appliances, cellular phones, and so forth. A typical piezoelectric sound component includes a diaphragm fixed in a case closed with a cover, as disclosed in Japanese Unexamined Patent Application Publication No. 2000-310990.

While electronic apparatuses are being greatly reduced in size nowadays, the piezoelectric sound component is desired to be of a surface-mountable type capable of being directly mounted on a circuit board. For a surface-mountable electronic component, the case and the cover of the electronic component must have a heat resistance higher than a reflow temperature. Accordingly, the case and the cover are formed of a heat-resistant resin, such as LCP (liquid crystal polymer), SPS (syndiotactic polystyrene), PPS (polyphenylene sulfide), or epoxy resin.

Reflow temperature depends on the constituents of the solder used. Recent restriction of lead-containing solder has been expanding the range of application of lead-free solder. While lead-containing solder is reflowed in the range of 220° C. to 240° C., lead-free solder is reflowed at a temperature of 250° C. or more and requires high heat resistance of the package of electronic components accordingly.

In general, the heat resistance or softening temperature of a resin case and cover is set to be higher than a reflow temperature. The shapes of the case and cover are therefore maintained without being softened by reflow. Reflow using lead-containing solder does not seriously affect the package structure having the case and cover. However, if a case and a cover formed of a resin having a softening temperature higher than the reflow temperature are subjected to a reflow process at a high temperature, a stress resulting from the difference in thermal expansion between the case and the cover is placed on their bonded surfaces. The stress is likely to undesirably cause the case and the cover to separate during reflow or in a subsequent drop impact test. Thermal expansion of resins, particularly LCP, is varied depending on molding conditions, shapes, flow directions, and so forth even in the same material, and difference in thermal expansion among portions is consequently large. Therefore, the foregoing problems become more pronounced.

SUMMARY OF THE INVENTION

In order to overcome the problems described above, preferred embodiments of the present invention provide a package for surface-mountable electronic components that is capable of reducing the stress applied to the bonded surfaces of the case and the cover by high temperature reflow soldering and that is capable of preventing separation of bonded surfaces and decreases in bonding strength that may occur after reflow.

According to a preferred embodiment of the present invention, a package of a surface-mountable electronic component which is to be reflow-soldered to a circuit board at a reflow temperature of about 250° C. or more, includes a case with an opening, holding an element of the electronic component therein, and a cover bonded to the case so as to close the opening. The case has a softening temperature that is higher than the reflow temperature, and the cover has a softening temperature that is lower than the reflow temperature.

If a case and a cover having a softening temperature higher than the reflow temperature are subjected to reflow using a lead-free solder at about 250° C. or more, an excessive stress is imparted to their bonded surfaces due to a difference between their thermal expansions. On the other hand, in preferred embodiments of the present invention, since the heat resistance or softening temperature of the cover is lower than the reflow temperature, the stress is compensated for by the softened cover. Softening temperature here refers to a temperature according to Method B specified in JIS K 7207. Thus, not only is separation of the cover from the case during reflow prevented, but also the decrease in bonding strength can be prevented even after reflow. In addition, if both the case and the cover have a softening temperature higher than the reflow temperature, undesired distortion remains in the case or the cover after reflow. In preferred embodiments of the present invention, softening the cover prevents the distortion after reflow. Since the softening temperature of the case is higher than the reflow temperature, no excessive load is applied to the element of the electronic component even if the element has a low strength. Thus, the characteristics of the element are prevented from being deviated or undesirably changed. Also, the outer dimensions are stabilized.

The case and the cover may preferably be formed of an LCP. LCP is suitable for surface-mountable electronic component packages because of its superior heat resistance and solvent resistance. However, thermal expansion of LCP is varied depending on molding conditions, shapes, flow directions, and so forth even in the same material, and the difference in thermal expansion among portions is consequently large. For example, the thermal expansion coefficient in the direction of molding flow is different from that in the direction perpendicular to the molding flow by several times to ten times. The combination of a case having a substantially U-shaped cross section and a flat cover inevitably produces a difference in thermal expansion coefficient between them. Accordingly, by using LCP and taking advantage of LCP characteristics, the separation of the bonded portion can be prevented effectively.

Preferably, the softening temperature of the cover is in the range of about 180° C. to about 240° C. In this instance, the cover is softened once by reflow, but the shape is advantageously maintained. In addition, inexpensive materials are available. The case and the cover may be bonded with an epoxy adhesive. Epoxy adhesives are inexpensive and have a high adhesive force. Alternatively, the case and the cover may be bonded with a silicone adhesive. Although silicone adhesives generate siloxane gas to contaminate the case during curing, the adhesive force of the silicon adhesives is not reduced by curing while the adhesive force of other adhesives (for example, epoxy adhesive) is reduced. Also, the Young's modulus is low so as to alleviate the stress on the bonded surfaces of the case and the cover exhibiting a large difference in thermal expansion.

The element may be a piezoelectric diaphragm that is vibrated in a bending mode in response to application of an alternate signal (alternating current signal or rectangular wave signal). The case may have a pair of fixed terminals for applying the alternate signal to the piezoelectric diaphragm, and at least one of the case and the cover has a sound release hole through which sound is released. The piezoelectric sound component, which is preferably used for cellular phones and other apparatuses, requires high drop impact properties. If the cover is separated from the case by drop impact after reflow, the acoustic space is broken and, consequently, desired sound pressure is not generated. By applying the combination of the case and the cover according to preferred embodiments of the present invention, the resulting surface-mountable piezoelectric sound component can exhibit superior drop impact properties.

In preferred embodiments of the present invention, the case and the cover respectively have softening temperatures higher than reflow temperature and lower than the reflow temperature. Consequently, the stress applied to the bonded surfaces, which is produced by the difference in thermal expansion between the case and the cover when, for example, lead-free reflow soldering is performed at a temperature of about 250° C. or more, is reduced because the stress is alleviated by the softened cover. As a result, separation of the cover from the case during reflow is prevented and decrease in bonding strength after reflow is alleviated. In addition, undesired distortion remaining in the case or the cover after reflow can be prevented. Since the softening temperature of the case is higher than the reflow temperature, no excessive load is applied to the element of the electronic component. Thus, the characteristics of the element are prevented from deviating.

Other features, elements, characteristics and advantages of the present invention will become more apparent from the following detailed description of preferred embodiments thereof with reference to the attached drawings.

DETAILED DESCRIPTION OF PREFERRED EMBODIMENTS

The preferred embodiments of the present invention will now be described with reference to the drawings.

First Preferred Embodiment

Figure 1:
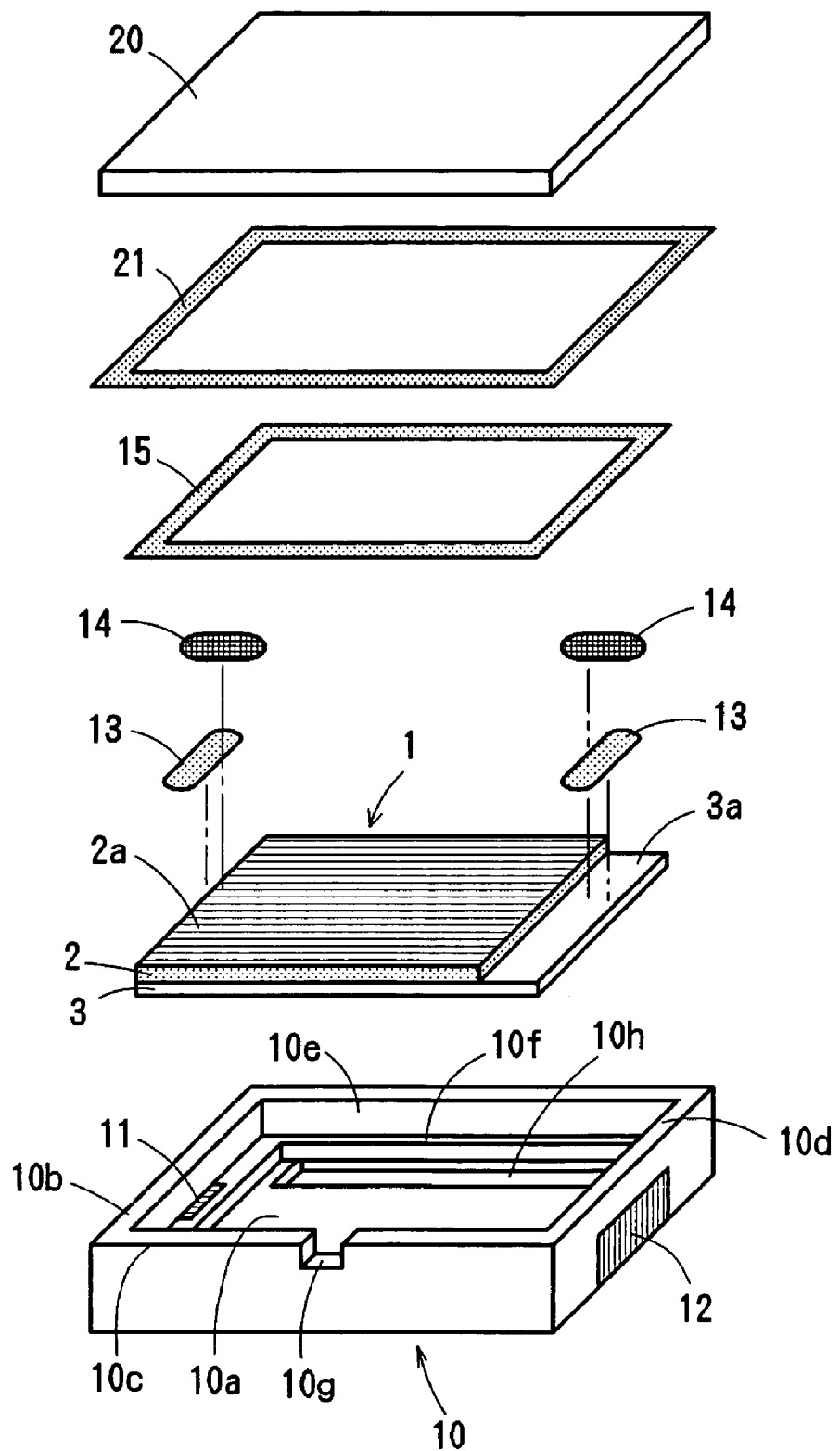
FIG. 1 is an exploded perspective view of a surface-mountable electronic component according to a first preferred embodiment of the present invention.
Figure 2:
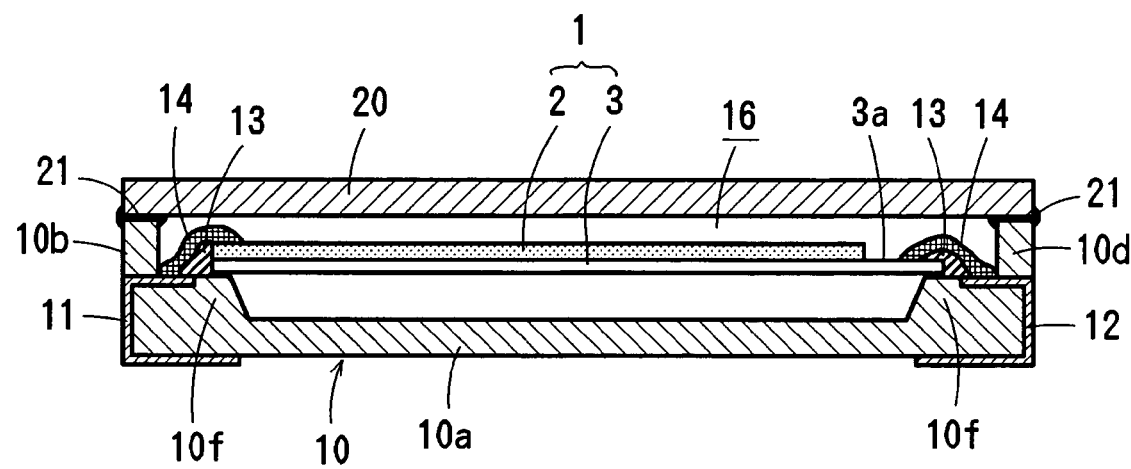
FIG. 2 is a sectional view of the electronic component shown in FIG. 1.
Figure 3:
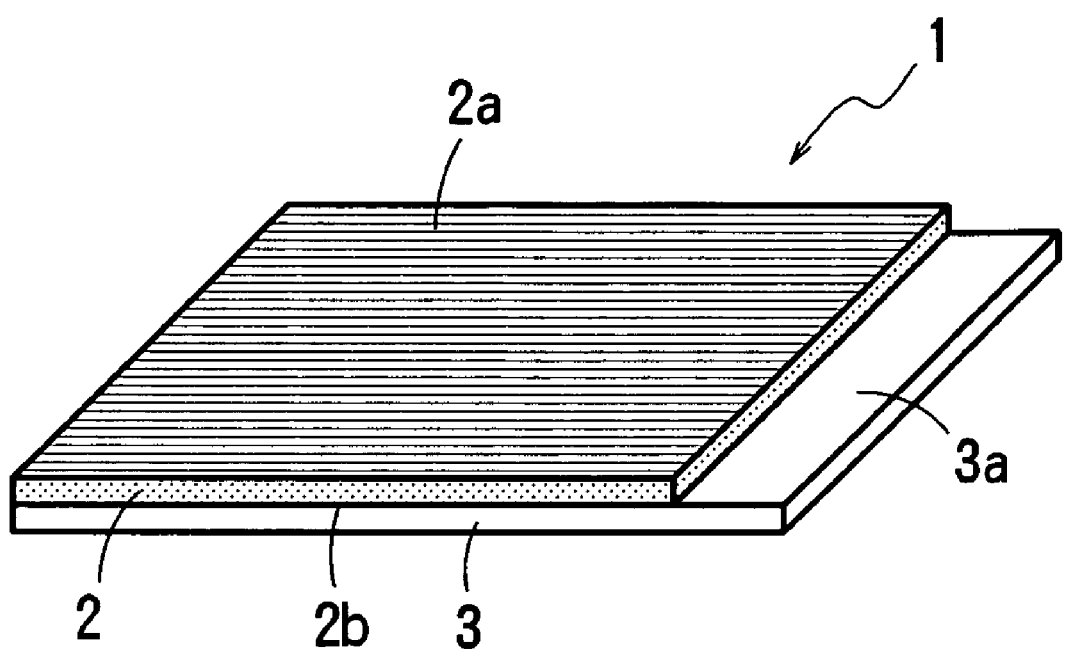
FIG. 3 is a perspective view of a diaphragm of the electronic component shown in FIG. 1.
Figure 4A:
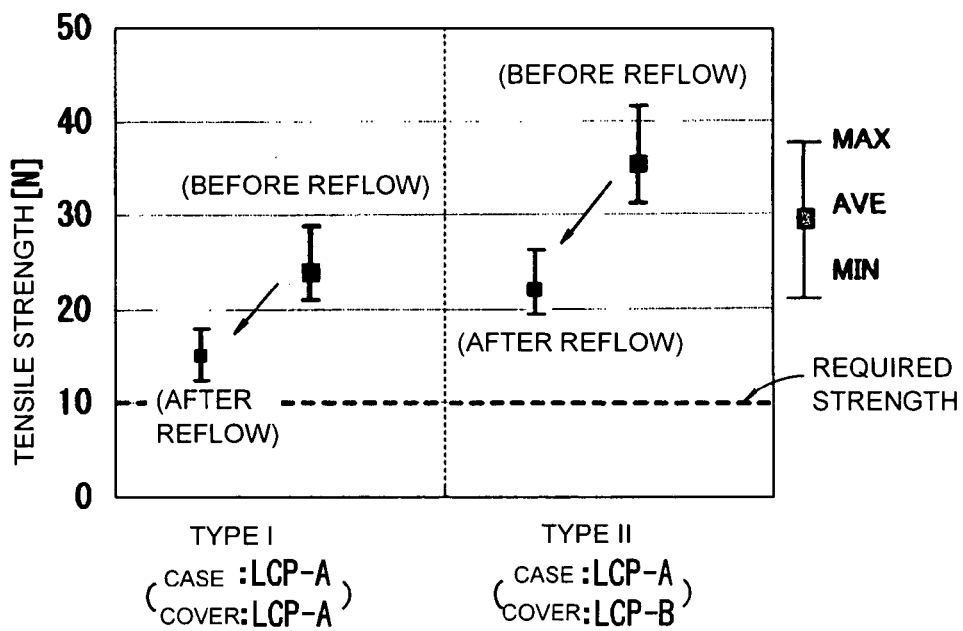
FIGS. 4A and 4B are plots of the bonding strengths before and after reflow of samples using a silicone adhesive.
Figure 4B:
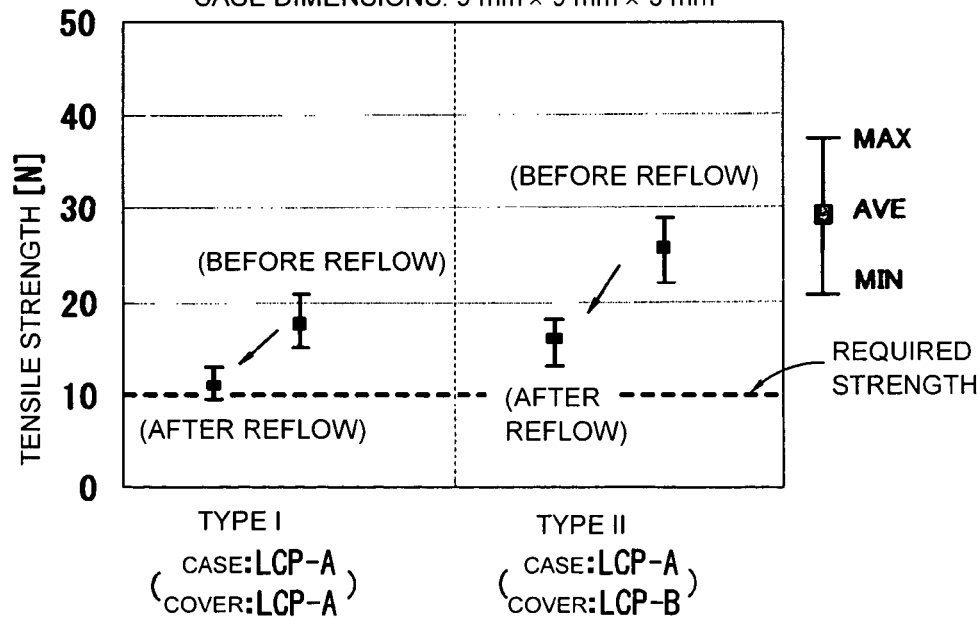
Figure 5A:
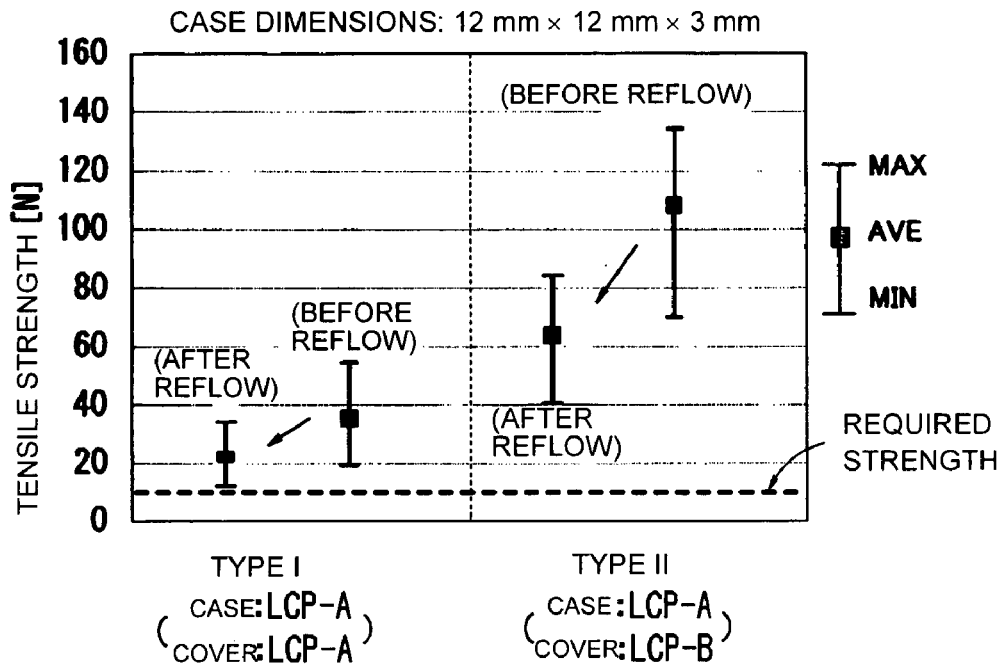
FIGS. 5A and 5B are plots of the bonding strengths before and after reflow of samples using an epoxy adhesive.
Figure 5B:
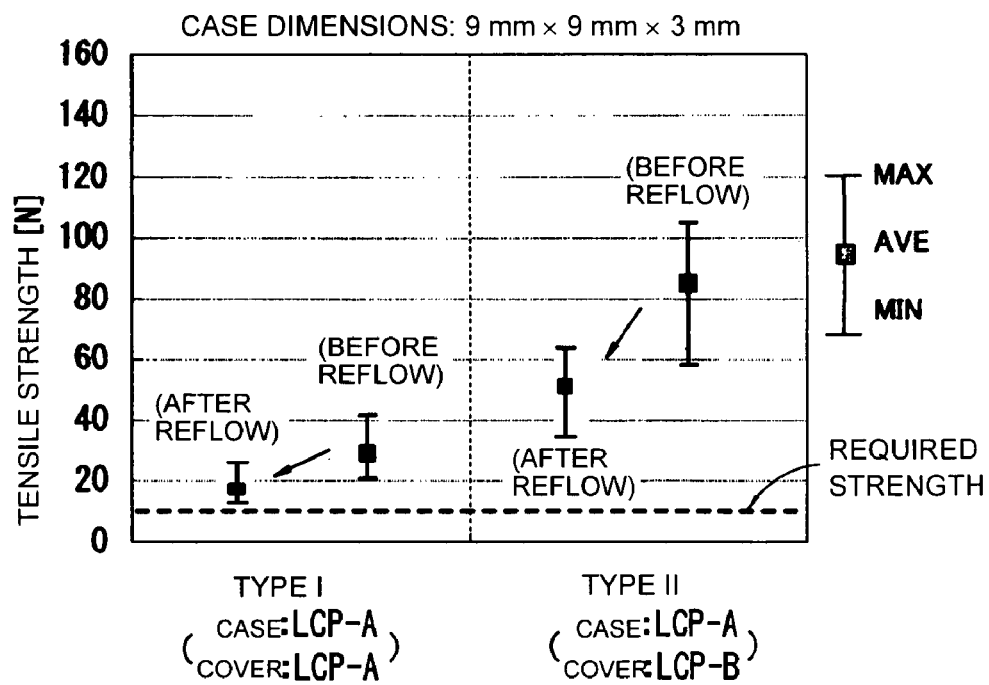

FIGS. 1 and 2 show a piezoelectric sound component, which is one type of surface-mountable electronic component, according to a first preferred embodiment of the present invention. The piezoelectric sound component generally includes a unimorph piezoelectric diaphragm 1, a case 10, and a cover 20.

The piezoelectric diaphragm 1 preferably includes a quadrangular piezoelectric plate 2 and a metal plate 3 preferably having substantially the same width as and a slightly larger length than the piezoelectric plate 2 has. The piezoelectric plate 2 has a top electrode 2a and a rear electrode 2b on its top and rear surfaces respectively and is polarized in the thickness direction. The rear electrode 2b is bonded to the metal plate 3 so as to oppose each other. In the present preferred embodiment, the piezoelectric plate 2 is bonded to the metal plate 3 so as to be shifted to one side in the length direction of the metal plate 3 and, thus, the metal plate 3 has an exposed portion 3a that is exposed at the other side. The piezoelectric plate 2 is preferably formed of a piezoelectric ceramic, such as PZT. The metal plate 3 is preferably formed of a conductive, spring-elastic material, and particularly a material with a Young's modulus close to that of the piezoelectric plate 2. For example, phosphor bronze or 42Ni is preferably used. A metal plate 3 formed of 42Ni has a thermal expansion coefficient close to that of ceramics, such as PZT, accordingly providing higher reliability.

The diaphragm 1 is housed in the case 10 in such a manner that both the sides of the diaphragm in the length direction are fixed. More specifically, the case 10 is formed of an insulative material, such as ceramic or a resin, in a form preferably having a substantially U-shaped cross section with a bottom 10a and four sidewalls 10b to 10e. The case also has a continuous supporting portion 10f for supporting the piezoelectric plate 1 at the inner sides of the sidewalls 10b to 10e. The case 10 is, for example, formed by integrally molding a heat-resistant resin, such as LCP, SPS, PPS, or epoxy resin, and particularly a resin having a softening temperature higher than reflow temperature. External connection terminals 11 and 12 are insert-molded in the shorter sidewalls 10b and 10d of the case 10 from the upper surfaces of the supporting portion 10f to the bottom surface of the case 10 through the external surfaces of the sidewalls 10b and 10d. Also, a notch 10g, from which sound is released, is formed in the upper side of one sidewall 10c of the longer sidewalls, and a damping hole 10h is formed in the bottom 10a in the vicinity of the other longer sidewall 10e.

The diaphragm 1 is disposed on the supporting portion 10f of the case 10 such that the metal plate 3 opposes the bottom 10a. The shorter sides of the diaphragm 1 are bonded to fix with an insulative adhesive 13 approximately at the centers thereof. The insulative adhesive 13 preferably includes an insulative material, such as epoxy resin or urethane. In the present preferred embodiment, a urethane adhesive, which is elastic, is used. After applying and curing the insulative adhesive 13, a conductive adhesive 14 is applied and cured so as to be disposed across the upper surface of the insulative adhesive 13. Consequently, the top electrode 2a is electrically connected to the external terminal 11 at one side of the diaphragm 1, and the exposed portion 3a of the metal plate 3 is electrically connected to the external terminal 12 at the other side.

In addition to fixing the two sides of the diaphragm 1 to the case 10, the insulative adhesive 13 provides an insulating film over the metal plate 3, thereby preventing a short-circuit resulting from contact of the conductive adhesive 14 with the metal plate 3. Furthermore, the insulative adhesive 13 functions as an elastic body for reducing a stress on the diaphragm 1 resulting from the shrinkage of the conductive adhesive 14 by curing. Then, an elastic sealant 15, such as silicone rubber, is applied to seal between the periphery of the diaphragm 1 and the internal surfaces of the sidewalls of the case 10.

After fixing the diaphragm 1 to the case 10 as above, the opening of the case 10 is closed with a cover 20 using an adhesive 21. The cover 20 is also formed in a plane, of a material similar to that of the case 10, having a softening temperature lower than the reflow temperature. For the adhesive 21, a silicone adhesive, an epoxy adhesive, or any other known adhesive may be used. By adhering the cover 20, an acoustic space 16 as shown in FIG. 2 is provided between the cover 20 and the diaphragm 1 and, thus, the surface-mountable piezoelectric sound component is completed.

By applying a predetermined alternate signal (alternating current signal or rectangular wave signal) between the terminals 11 and 12, the diaphragm 1, whose entire outer region is supported by the case 10, is bending-vibrated to generate a predetermined sound. The sound is released to the outside through a sound release defined by the cover 20 and the notch 10g of the case 10. The sound release hole may of course be provided in the cover 20, instead of the sidewall of the case 10. The diaphragm 1, whose entire outer region is supported by the supporting portion 10f in the present preferred embodiment, may be supported at its two opposing sides or at its four corners so that the other portions are movable. The resonance frequency of the diaphragm 1 depends on the shape and area of the supporting portion.

The piezoelectric sound component is reflow-soldered on a circuit board. At this time, the case 10 and the cover 20 are differently expanded by heat. This difference in thermal expansion produces stress on the bonded surfaces and, thus, the cover 20 is likely to separate from the case 10 disadvantageously during reflow or in a subsequent drop impact test. Accordingly, the case 10 is formed of a resin having a softening temperature higher than the reflow temperature, and the cover 20 is formed of another resin having a softening temperature lower than the reflow temperature, in preferred embodiments of the present invention. Thus, the difference in thermal expansion by reflow is compensated for by softening the cover 20 to reduce the stress on the bonded portion.

FIGS. 4A, 4B, 5A, and 5B show the results obtained from the measurements of the bonding strengths (tensile strength) before and after reflow between the case 10 and the cover 20. For FIGS. 4A and 4B, a silicon adhesive was used as the adhesive 21 for FIGS. 5A and 5B, an epoxy adhesive was used as the adhesive 21. The reflow temperature was set at about 260° C. For FIGS. 4A and 5A, the case measured approximately 12 mm in square by approximately 3 mm in height, with a case wall thickness (adhesion width) of about 0.5 mm and an adhesive thickness of about 0.04 mm. For FIGS. 4B and 5B, the case measured approximately 9 mm in square by approximately 3 mm in height, with a case wall thickness (adhesion width) of about 0.3 mm and an adhesive thickness of about 0.04 mm. The case and the cover were formed of two types of LCP, namely, types A and B. LCP-A has a softening temperature that is higher than the reflow temperature, and LCP-B has a softening temperature that is lower than the reflow temperature.

LCP-A:
Softening temperature: about 250° C. to about 350° C.
Young's modulus: about 1,400 MPa
Thermal expansion coefficient (in the molding flow direction): about $12 \times 10^{-6}$/° C.
Thermal expansion coefficient (in the direction perpendicular to molding flow): about $43 \times 10^{-6}$/° C.

LCP-B:
Softening temperature: about 180° C. to about 240° C.
Young's modulus: about 1,200 MPa
Thermal expansion coefficient (in the molding flow direction): about $4 \times 10^{-6}$/° C.
Thermal expansion coefficient (in the direction perpendicular to molding flow): about $50 \times 10^{-6}$/° C.

Silicone Adhesive
Young's modulus: about 1.0 MPa
Thermal expansion coefficient: about $235 \times 10^{-6}$/° C.

Epoxy Adhesive:
Young's modulus: about 3,000 MPa
Thermal expansion coefficient: about $57 \times 10^{-6}$/° C.

Type I refers to the case (comparative example) where LCP-A is used for both the case and the cover; Type II, the case (an example of preferred embodiments of the present invention) where LCP-A and LCP-B are respectively used for the case and the cover.

As shown in FIGS. 4A to 5B, the bonding strength after reflow was reduced in comparison with before reflow in both samples using the silicone adhesive and the epoxy adhesive. In the sample (known type) of Type I using the silicone adhesive, although the case and the cover were formed of heat-resistant LCP-A, the bonding strength after reflow was so low as to barely satisfy a strength (10 N) required by drop impact test. On the other hand, the sample (present invention) of Type II, in which the cover was formed of LCP-B having a lower heat resistance while the case was formed of LCP-A having a higher heat resistance, shows that the bonding strength after reflow was high so as to sufficiently satisfy the required strength. The samples using the epoxy adhesive showed substantially the same results as the samples using the silicone adhesive. The epoxy adhesive can provide a more reliable package because epoxy adhesives produce a bonding strength (about 30 N to about 40 N) after reflow that is higher than that of silicone adhesives.

Second Preferred Embodiment

Figure 6:
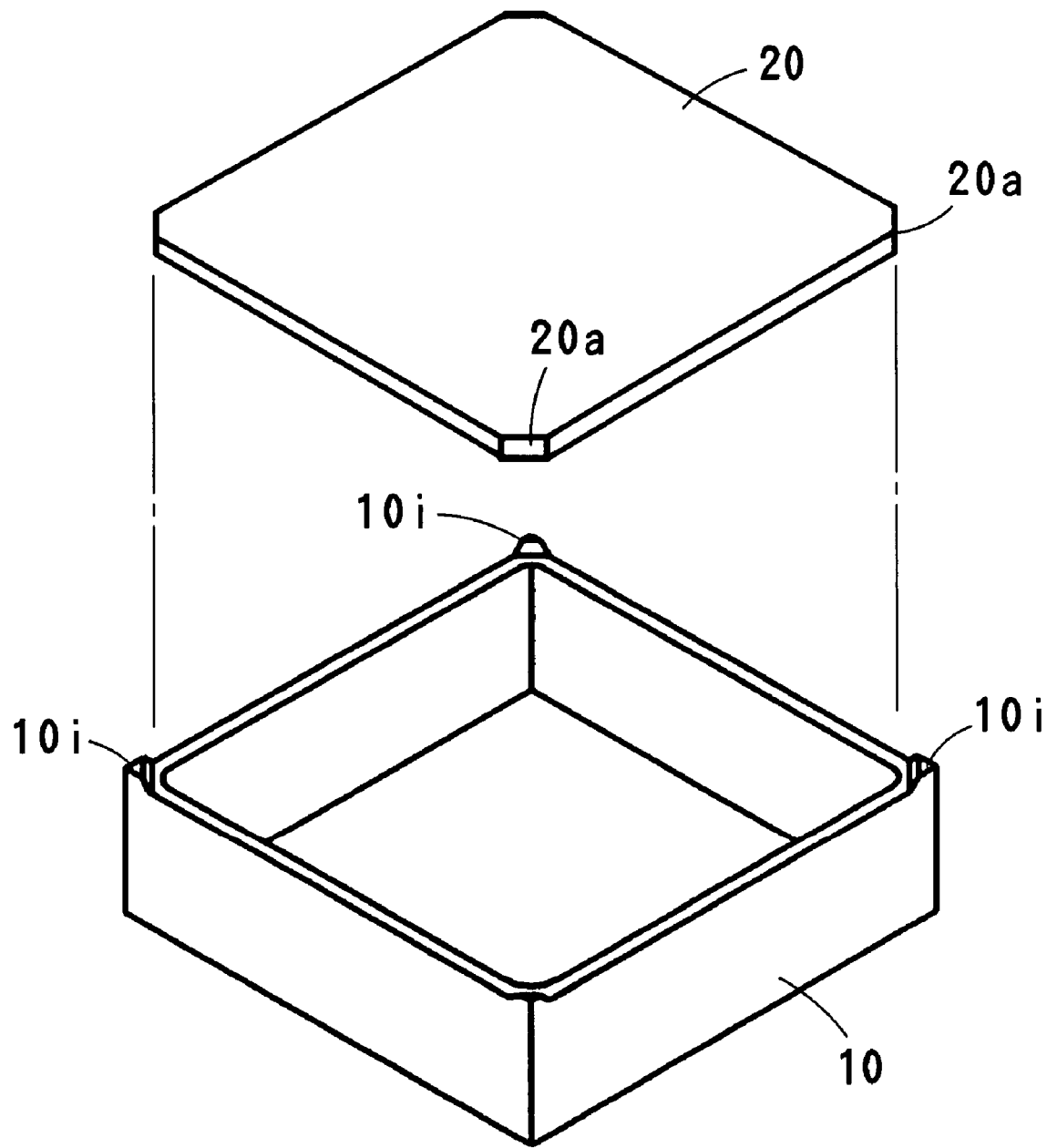
FIG. 6 is an exploded perspective view of a package of a surface-mountable electronic component according to a second preferred embodiment of the present invention.

FIG. 6 shows a package structure according to a second preferred embodiment of the present invention. However, the element of the electronic component, such as a piezoelectric diaphragm, contained in the case 10 and terminals are omitted from FIG. 6. In the present preferred embodiment, the case 10 had protrusions 10i at the top corners and the cover 20 has cut surfaces 20a at the corners, in order to prevent the cover 20 from being displaced. The case 10 and the cover 20 are bonded with a known adhesive, such as an epoxy or a silicone adhesive in the present preferred embodiment as in the first preferred embodiment. The case 10 has a softening temperature that is higher than the reflow temperature, and the cover 20 has a softening temperature that is lower than the reflow temperature. As described above, a difference in thermal expansion between the case 10 and the cover 20 during reflow produces stress on the bonded portion in the present invention. However, the softening temperature of the cover 20 that is lower than the reflow temperature reduces the stress, thus preventing the separation of the bonded surfaces and the decrease in bonding strength. In addition, the protrusions 10i at the corners of the case 10 prevent the cover 20 from shifting in four directions.

While the present invention has been described using the preferred embodiments, various modifications in form and detail may be made without departing from the scope and spirit of the invention. Although the cases preferably having a substantially U-shaped cross section and the plat covers are used in the foregoing preferred embodiments, they are not limited to these forms. For example, the package may include a reverse, substantially U-shaped case and a base plate underlying the case, with an element held in the case and terminal electrodes provided to the base plate. Alternatively, both the case and the cover may have a substantially U-shaped cross section, and their open sides may be bonded to each other. For bonding the case and the cover, ultrasonic welding, thermo-compression bonding, and other bonding techniques may be applied in addition to using an adhesive. While the case and the cover are preferably formed of LCP in the foregoing preferred embodiments, another heat-resistant resin, such as SPS, PPS, or epoxy resin, may be used.

The element of the electronic component is not limited to the diaphragm used in the preferred embodiments described above. Also, the diaphragm is not limited to the unimorph type including a metal plate and a piezoelectric plate bonded to each other, and a bimorph diaphragm may be used which includes ceramic layers with an internal electrode therebetween.

What is claimed is:

1. A package of a surface-mountable electronic component to be reflow-soldered to a circuit board at a reflow temperature of about 250° C. or more, the package comprising:
 a case with an opening, holding an element of the electronic component therein, the case having a softening temperature that is higher than the reflow temperature; and
 a cover bonded to the case so as to close the opening, the cover having a softening temperature that is lower than the reflow temperature; wherein
 the case is made of an insulative material;
 the cover is made of a resin; and
 the cover is bonded to the case with an adhesive.

2. The package according to claim 1, wherein each of the case and the cover includes a liquid crystal polymer.

3. The package according to claim 1, wherein the softening temperature of the cover is in the range of about 180° C. to about 240° C.

4. The package according to claim 1, wherein the adhesive is an epoxy adhesive.

5. The package according to claim 1, wherein the adhesive is a silicon adhesive.

6. The package according to claim 1, wherein the element is a piezoelectric diaphragm which is bending-vibrated in response to application of an alternate signal, the case has a pair of terminals fixed thereto for applying the alternate signal to the piezoelectric diaphragm, and at least one of the case and the cover has a sound release hole through which sound is released.

7. The package according to claim 1, wherein the element is a unimorph piezoelectric diaphragm.

8. The package according to claim 1, wherein the element is a piezoelectric diaphragm which includes a quadrangular piezoelectric plate and a metal plate.

9. The package according to claim 1, wherein the case includes protrusions at top corners thereof.

10. The package according to claim 1, wherein the cover has cut surfaces at corners thereof.

11. An electronic apparatus comprising:
 an electronic component; and
 a package containing the electronic component and arranged to be reflow-soldered to a circuit board at a reflow temperature of about 250° C. or more, the package including a case with an opening, holding an element of the electronic component therein, the case having a softening temperature that is higher than the reflow temperature, and a cover bonded to the case so as to close the opening, the cover having a softening temperature that is lower than the reflow temperature; wherein
 the case is made of an insulative material;
 the cover is made of a resin; and
 the cover is bonded to the case with an adhesive.

12. The electronic apparatus according to claim 11, wherein each of the case and the cover includes a liquid crystal polymer.

13. The electronic apparatus according to claim 11, wherein the softening temperature of the cover is in the range of about 180° C. to about 240° C.

14. The electronic apparatus according to claim 11, wherein the adhesive is an epoxy adhesive.

15. The electronic apparatus according to claim 11, wherein the adhesive is a silicon adhesive.

16. The electronic apparatus according to claim 11, wherein the electronic component is a piezoelectric diaphragm which is bending-vibrated in response to application of an alternate signal, the case has a pair of terminals fixed thereto for applying the alternate signal to the piezoelectric diaphragm, and at least one of the case and the cover has a sound release hole through which sound is released.

17. The electronic apparatus according to claim 11, wherein the electronic component is a unimorph piezoelectric diaphragm.

18. The electronic apparatus according to claim 11, wherein the electronic component is a piezoelectric diaphragm which includes a quadrangular piezoelectric plate and a metal plate.

19. The electronic apparatus according to claim 11, wherein the case includes protrusions at top corners thereof.

20. The electronic apparatus according to claim 11, wherein the cover has cut surfaces at corners thereof.

* * * * *